US012316343B2

(12) United States Patent
Lanka et al.

(10) Patent No.: US 12,316,343 B2
(45) Date of Patent: May 27, 2025

(54) PHY-BASED RETRY TECHNIQUES FOR DIE-TO-DIE INTERFACES

(71) Applicant: Intel Corporation, Santa Clara, CA (US)

(72) Inventors: Narasimha Lanka, Dublin, CA (US); Lakshmipriya Seshan, Sunnyvale, CA (US); Debendra Das Sharma, Saratoga, CA (US); Zuoguo Wu, San Jose, CA (US); Gerald S. Pasdast, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 822 days.

(21) Appl. No.: 17/359,517

(22) Filed: Jun. 26, 2021

(65) Prior Publication Data

US 2021/0344354 A1   Nov. 4, 2021

(51) Int. Cl.
*H03M 13/11* (2006.01)
*H03M 13/00* (2006.01)

(52) U.S. Cl.
CPC ...... *H03M 13/1105* (2013.01); *H03M 13/611* (2013.01)

(58) Field of Classification Search
CPC . H03M 13/1105; H03M 13/611; H03M 13/09
See application file for complete search history.

(56) References Cited

U.S. PATENT DOCUMENTS

| | | | |
|---|---|---|---|
| 2007/0115823 A1* | 5/2007 | Shen | H04L 1/1874 370/235 |
| 2009/0010252 A1* | 1/2009 | Tsang | H04L 49/508 370/389 |
| 2013/0073919 A1* | 3/2013 | Sano | H04L 1/1803 714/E11.131 |
| 2017/0288814 A1* | 10/2017 | Lesartre | H04L 1/1835 |

* cited by examiner

*Primary Examiner* — Thien Nguyen
(74) *Attorney, Agent, or Firm* — Alliance IP, LLC

(57) ABSTRACT

In one embodiment, an apparatus includes PHY circuitry to implement a PHY-based retry technique, e.g., in die-to-die interfaces. The PHY circuitry includes a retry buffer to buffer data provided by the interface controller and error detection code generation circuitry to generate error detection codes based on input data. The PHY circuitry is to implement the retry technique by detecting a stall signal asserted by another apparatus across the channel, causing the error detection code generation circuitry to generate error detection codes based on data in the retry buffer, and transmitting the data from the retry buffer and its corresponding error detection codes across the channel to the other apparatus.

23 Claims, 7 Drawing Sheets

PHY-BASED RETRY TECHNIQUES FOR DIE-TO-DIE INTERFACES

TECHNICAL FIELD

This disclosure relates in general to the field of computer systems and, more particularly, to a physical layer (PHY)-based retry techniques for die-to-die interfaces.

BACKGROUND

Very wide parallel die-to-die interfaces (e.g., a modular die interface (MDI)) may be specified to operate at a very low bit error rate (BER), e.g., to meet stringent system failure in time (FIT) requirements. This can make die disaggregation possible by allowing multiple separate dies to operate in a similar manner to a single die. The low BER requirement can be a burden to increasing the operating speeds of the die-to-die interface, however.

BRIEF DESCRIPTION OF THE DRAWINGS

Like reference numbers and designations in the various drawings indicate like elements.

DETAILED DESCRIPTION OF EXAMPLE EMBODIMENTS

Figure 1:
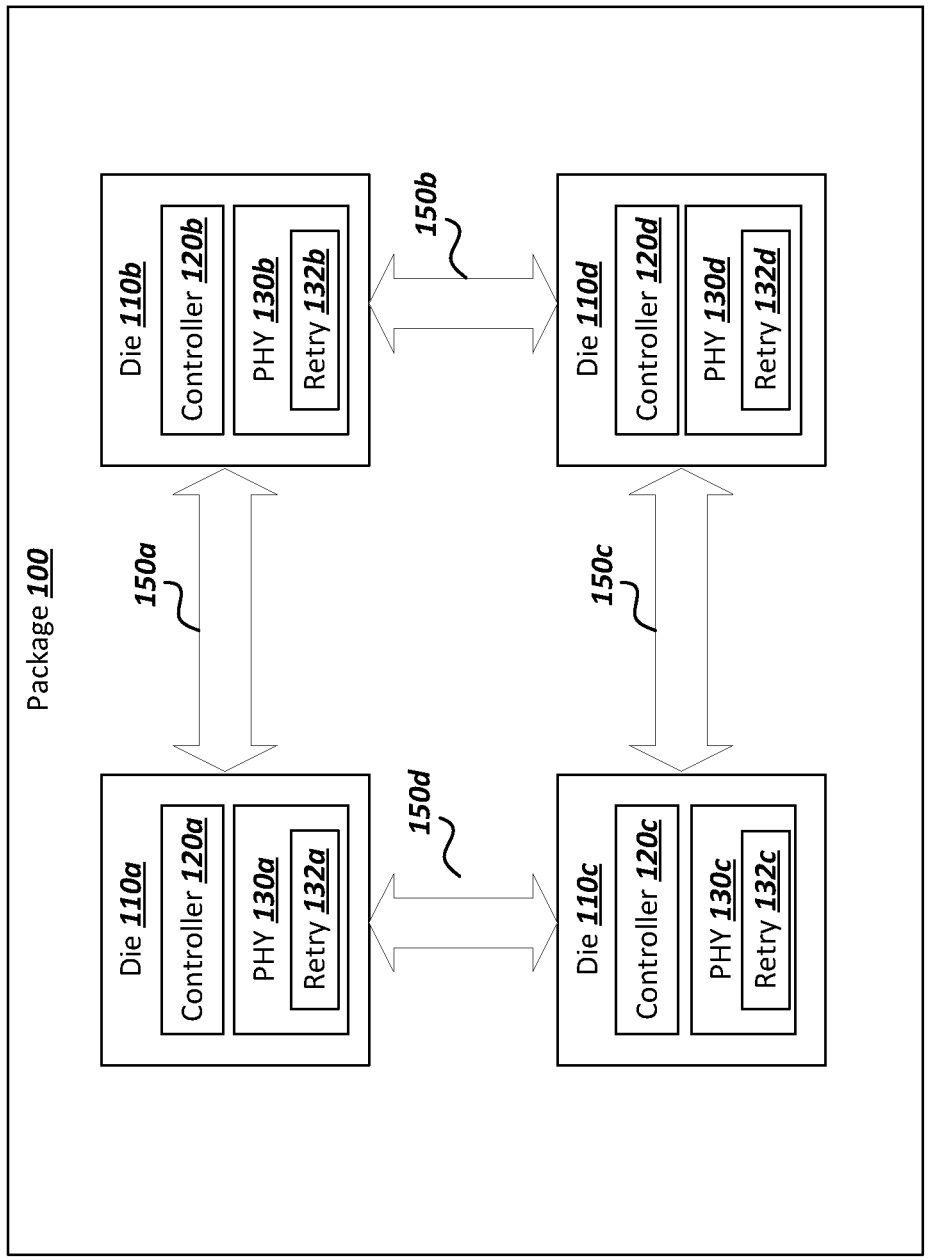
FIG. 1 illustrates an example multi-die package that includes die-to-die interfaces in accordance with embodiments of the present disclosure.

In the following description, numerous specific details are set forth, such as examples of specific configurations, structures, architectural details, etc. in order to provide a thorough understanding of the present disclosure. It will be apparent, however, to one skilled in the art that these specific details need not be employed to practice embodiments of the present disclosure. In some instances, well known components or methods may be utilized, and such details haven't been described in detail in order to avoid unnecessarily obscuring embodiments of the present disclosure.

Very wide parallel die-to-die interfaces (e.g., a MDI) may be specified to operate at a very low bit error rate (BER), e.g., to meet stringent system failure in time (FIT) requirements. This can make die disaggregation possible by allowing multiple separate dies to operate in a similar manner to a single die. The low BER requirement can be a burden to increasing the operating speeds of the die-to-die interface, however.

Mechanisms to relax this BER requirement while also meeting the FIT rate can allow these die-to-die links to operate at faster data rates and improve system performance. Such mechanisms should also incur minimal latency penalty, as any substantial increase in latency has a direct impact on the system performance. Previous attempt to introduce such mechanisms have included controller-based retry mechanisms with a cyclic redundancy check (CRC) detection scheme to work around a higher BER requirement, controller-based forward error correction (FEC) mechanisms, and jitter reductions through circuit and power noise improvements while having a low BER, such as, e.g., $10^{-27}$. However, these mechanisms can require the existence of a controller that implements a retry or FEC mechanism. Very often, die-to-die interfaces are controller-agnostic and any requirements of retry or FEC implementation will be additional burdens on the existing controllers, in addition to the high latency, area/space, or power implications. Further, the jitter reduction mechanisms may require more stringent power delivery performance, which may need additional power delivery resources. This is often very difficult on in input/output interfaces or interconnects (which may be referred to herein as "IOs") with very small bump pitch. Circuit jitter improvements can also limit the performance by limiting the data rate.

Aspects of the present disclosure provide physical layer (PHY)-based retry mechanisms to relax the link BER in die-to-die interfaces. In particular embodiments, for example, error detection may be performed using CRC information transmitted over the link, and a back pressure/retry request may be issued to stall traffic in the event of a detected error. An inline or parallel Tx first-in/first-out (FIFO) buffer may store a few cycles of previous data, and a retry mechanism may be implemented to resend the data after an error is detected. Embodiments herein may provide one or more advantages over current approaches to die-to-die interfaces, including, for example, relaxing BER requirements to allow data rate increase without additional penalty on circuit power, area, or power delivery resources, allowing die-to-die interface PHY circuitry to be controller-agnostic, i.e., not requiring a retry mechanism in the controller to deliver low-latency, and providing for a tightly controlled and optimized retry buffer depth, resulting in lower retry latency and power (e.g., through fewer circuit elements).

Error detection and correction is one way to relax the BER requirements for link-related errors in high performance IOs. Typically, these are implemented in the logical and/or the protocol layer of the IO subsystem. BER relaxation in such implementations is directly proportional to the number of corrected errors. Error correction codes can range from simple single error correction codes to multi-symbol correction codes like Reed-Solomon codes. The implementation cost and complexity increase substantially with the correction capability. Furthermore, there is a significant latency penalty for correction capability.

Another method that is employed to achieve the required FIT rate of the system is retry, which may refer to resending data in response to a detected error. When an error is detected on the receiver, for instance, a NAK (negative/not acknowledged) signal may be sent to the Tx side controller, and the controller may initiate a resend of the required data. However, the round-trip latency of such a mechanism is significant (several 10's to 100's of ns) because of distances the signals need to traverse, and the buffer depth that may be required can be very large depending on the round-trip latency of the ACK/NAK signal. Furthermore, the controller needs to be configured to support this feature. Thus, if an IO needs to leverage the BER advantage with a controller that does not support error based retry, adding this feature may be significant burden for the controller.

Accordingly, embodiments of the present disclosure may implement an IO-based retry scheme. Some advantages of such an implementation may include: a mechanism that allows the IO to be made controller-agnostic, which can be very useful in general purpose IOs where the IO physical layer can be attached to any controller with minimal requirements. In addition, in certain scenarios, e.g., low latency IO implementations, where the PHY latency is tightly controlled, the required buffer depth can be significantly reduced. The result is reduced retry latency and power. Further, a lower FIT rate and/or relaxed BER may be achieved through a retry mechanism that will enable the PHY to run at higher data rates with same circuitry and power delivery resources, or to get back power and area with relaxed circuit and power delivery requirements.

Aspects of the present disclosure may be applied to a die-to-die interface where the BER requirements are very stringent (e.g., better than 1e-25) or where a PHY implementation already achieves a low BER (meaning the error occurrence is very rare). Moreover, embodiments of the present disclosure may enable correction of link transmission (i.e., PHY based) errors.

FIG. 1 illustrates an example multi-die package 100 that includes die-to-die interfaces 150 in accordance with embodiments of the present disclosure. The example multi-die package 100 includes dies 110 that are coupled to one another through the die-to-die interfaces 150. Each die 110 may be implemented as any suitable type of package die, and may be implemented as a processor, accelerator, memory module, input/output (IO) circuitry (e.g., a PCIe root complex or controller hub), silicon photonic module, a radio chip (e.g., a baseband processor), a field programmable gate array (FPGA), application-specific integrated circuit (ASIC), other types of integrated circuits (IC), or the like. The package 100 may be implemented as a system-on-chip (SoC), which may be implemented on any packaging technology such as Ball Grid Array (BGA), Interposer, etc. Each die-to-die interface 150 may be implemented as a parallel interface/interconnect between two dies 110.

Each die 110 includes a controller 120 and PHY circuitry 130. The controller may include hardware logic or circuitry to implement link layer protocols on the interface(s) 150 via the PHY circuitry 130, while the PHY circuitry 130 may include hardware circuitry to transmit and receive electrical signals over the interfaces based on information or commands from the controller 120. The PHY circuitry 130 may implement one or more components, aspects, or techniques as described further below to enable a PHY-based retry method (as opposed to a controller-based method). In some cases, the controller 120 may be agnostic or unaware of the retry circuitry/techniques of the PHY circuitry 130.

The PHY circuitries 130 each include respective retry logic circuitry 132 that is configured to implement a PHY-based retry mechanism, such as those described below. Although FIG. 1 illustrates intra-package interface links 150, it will be understood that aspects of the present disclosure may also be applied to inter-package links between dies as well.

Figure 2:
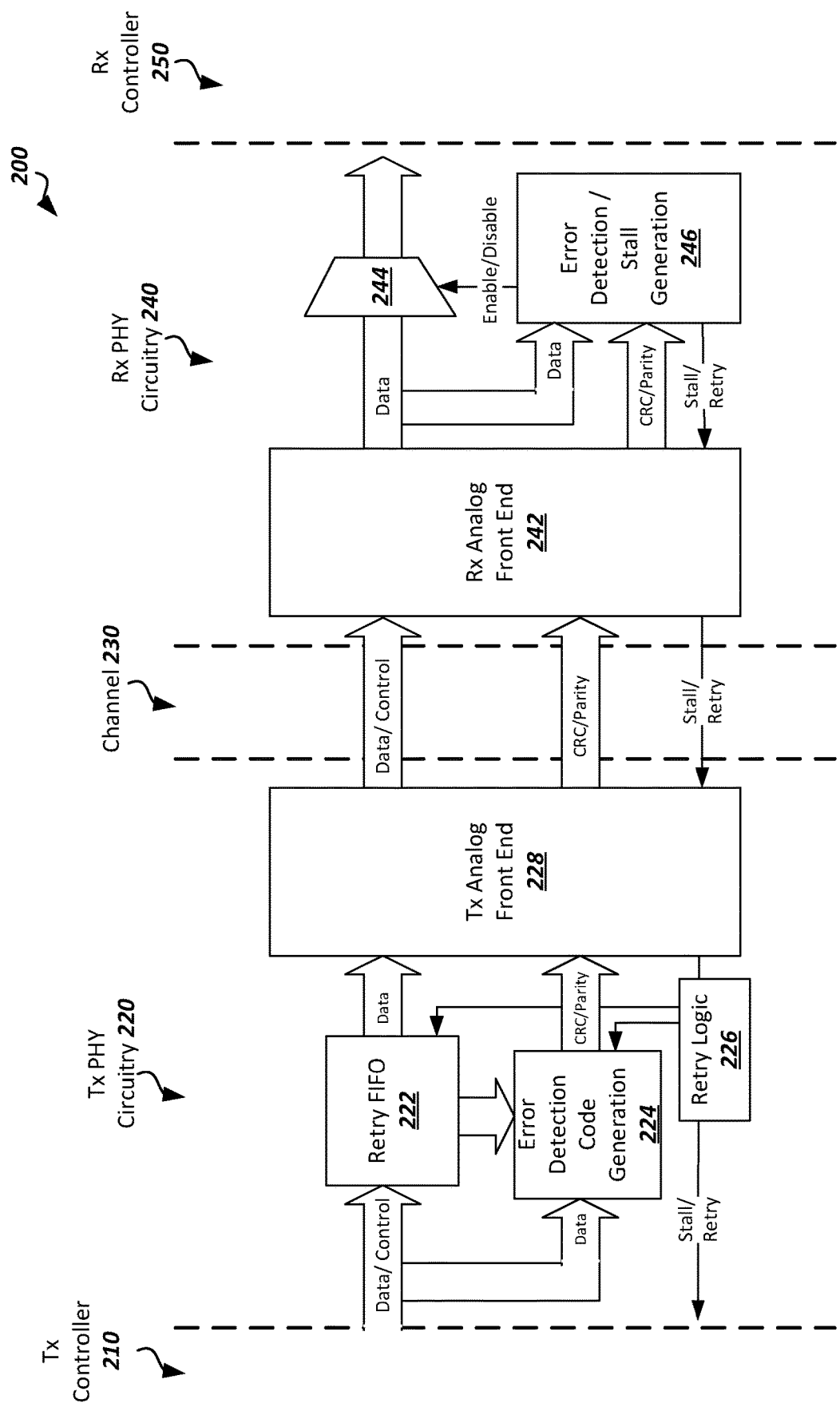
FIG. 2 illustrates an example physical layer (PHY)-based retry system in accordance with embodiments of the present disclosure.

FIG. 2 illustrates an example physical layer (PHY)-based retry system 200 in accordance with embodiments of the present disclosure. The example system 200 includes aspects of each side (Tx/Rx) of a die-to-die interface link (e.g., 150 of FIG. 1). For instance, the system 200 includes a transmit-side controller 210 (which may be implemented similar to the controllers 120 of FIG. 1) and transmit-side PHY circuitry 220 (which may be implemented similar to the PHY circuitry 130 of FIG. 1) that are coupled to receiver-side PHY circuitry 240 (which may be implemented similar to the PHY circuitry 130 of FIG. 1) and a receiver-side controller 250 (which may be implemented similar to the controllers 120 of FIG. 1) via a channel 230 (which may be implemented similar to the interfaces 150 of FIG. 1). For purposes of illustration of the retry mechanism disclosed herein, only certain aspects of each component of system 200 are shown. That is, each controller and PHY circuitry may include additional components beyond those shown in FIG. 2. Additionally, it will be understood that each side may include the circuitry shown on the opposite side of the channel 230. That is, the transmit side (left) of FIG. 2 may include aspects of the Rx PHY circuitry 240 and Rx controller 250, and the receive side (right) of FIG. 2 may include aspects of the Tx PHY circuitry 210 and Tx controller 220.

In the example shown, the PHY circuitries 220, 240 implement an error code (e.g., CRC, parity bit) generation and checking scheme. Any detected error will trigger a retry and attempt to correct the link transmission related errors. This will not only simplify implementation but also save power. The implementation of the retry scheme can be chosen, in certain embodiments, based on the particular PHY circuitry implementation. For instance, the retry mechanism choice ay be dependent on the bit error rate (BER) requirement of the system, and different error detection capabilities may be required, depending on the error probability (which is implementation specific).

The example Tx PHY circuitry 220 includes a retry FIFO buffer 222, error detection code generation circuitry 224, retry logic circuitry 226, and analog front end (AFE) circuitry 228, and the example Rx PHY circuitry 240 includes AFE circuitry 242, a multiplexer 244, and error detection/stall generation circuitry 246. As shown, the data signal ("Data/control") that would normally be transmitted by the PHY circuitry 220 is input to the retry FIFO buffer 222 and the error detection code generation circuitry 224. In normal operation, the Tx PHY circuitry 220 transmits the data/control signal across the channel 230 via the AFE circuitry 228 along with an entry indication for the retry FIFO buffer 222. The Tx PHY circuitry 220 also transmits in parallel a corresponding error detection code (e.g., one or more parity bits or a CRC) generated by the error detection code generation circuitry 224. Although shown as being sent in parallel, in certain embodiments, the data and error detection code may be serialized and sent over the channel 230 in a serial manner. Although shown as a FIFO buffer, the retry buffer may be any suitable type of buffer, e.g., an elastic buffer.

The AFE circuitry 242 receives the data and error detection code transmitted over the channel 230 and passes each as input to the error detection/stall generation circuitry 246, which detects whether a link transmission error has occurred using the data and corresponding error detection code. If no error is detected, the error detection/stall generation circuitry 246 passes an "enable" signal (e.g., a digital 1) to the multiplexer 244 which causes the multiplexer 244 to pass the data signal to the Rx controller 250 for processing. If, on the other hand, an error is detected by the error detection/stall generation circuitry 246, the circuitry will cause a "Stall/Retry" signal to be transmitted back to the transmitter side as shown. The error detection/stall generation circuitry 246 also passes a "disable" signal (e.g., a digital 0) to the multiplexer 244 which causes the multiplexer 244 to prevent the Rx controller 250 from receiving the transmitted data.

On the transmit side, the Tx controller 210 (and/or any upper layer) and the retry logic 226 consume the "Stall/Retry" signal. Once a "Stall/Retry" signal issued by the error detection/stall generation circuitry 246 is received at the Tx controller 210, the controller stops sending additional data until the signal has been de-asserted. Thus, the retry operations may be viewed as a normal "stall" event by the Tx controller 210. Depending on the number of cycles for transmission latency and time for the controller to stop traffic, the Tx controller 210 may continue to send traffic, with the traffic being loaded into the retry FIFO buffer 222. The retry FIFO buffer may be fixed depth, and the depth may be determined based on the Stall/Retry transmission latency and/or the time required for the Tx controller 210 to stop traffic.

The retry logic 226 includes hardware circuitry to implement the PHY-based retry mechanism. The retry logic 226, after receiving the "Stall/Retry" signal, causes data from the retry FIFO buffer 222 ("retry data") to be transmitted over the channel 230. For example, the retry logic 226 may cause the first entry of the retry FIFO buffer 222 to be transmitted. That is, the data may be sent from the retry FIFO buffer 222 from the pointer at which the buffer started filling. As the retry FIFO buffer 222 is a fixed depth, the pointers may change as new entries are added.

The retry logic 226 also causes the error detection code generation circuitry 224 to receive the retry data from the retry FIFO buffer 222 as input instead of data from the Tx controller 210. Thus, the data transmitted from the retry FIFO buffer 222 is provided to the error detection code generation circuitry 224, which generates an error detection code corresponding to the retry data (rather than data from the Tx controller 210). The retry data and corresponding error detection code(s) are transmitted across the channel 230 to the Rx PHY circuitry 240. The error detection/stall generation circuitry 246 then detects whether there has been any link transmission error in the retry data based on the corresponding error correction codes.

If no error is detected in the retry data, then the error detection/stall generation circuitry 246 may allow for the data to be passed to the Rx controller 250. The error detection/stall generation circuitry 246 may determine to pass the data to the Rx controller 250 based on a count and/or indication of a last valid data. For example, the error detection/stall generation circuitry 246 may keep a count of data packets transmitted during the retry phase and may compare the count against the buffer position indication of the last known "good" data that was transmitted in the normal operation phase.

The error detection/stall generation circuitry 246 de-asserts the "Stall/Retry" signal when it receives all the retry data from the Tx, indicating to the Tx controller 210 to restart data transmission and to the retry logic 226 to resume normal data transmission operations, i.e., for the error detection code generation circuitry 224 to begin receiving data from the Tx controller 210 to generate the error detection codes for transmission with the data over the channel 230.

Retry mechanisms such as the one described above may provide one or more of the following latency advantages over error correction schemes. In an error correction scheme, data from every cycle may have to pass through the checking/correction engine whether an error occurred or not. Every cycle is subjected to a latency penalty caused by this checking/correction. In this retry scheme, by comparison, the additional latency when an error has occurred can be larger than the error correction scheme. However, since the error occurrence is very rare, the aggregate latency penalty may be much smaller overall.

Certain high-density die-to-die interfaces with a FIT<=1 requirement may need a per lane BER better than 1e-25. Since the retry mechanism described above may correct all the errors per occurrence, the raw BER requirement can be relaxed to 1e-12, for example. The BER relaxation may be implementation specific and may depend, for example, on retry latency and/or an allowed number of retries without affecting the system performance.

Figure 3:
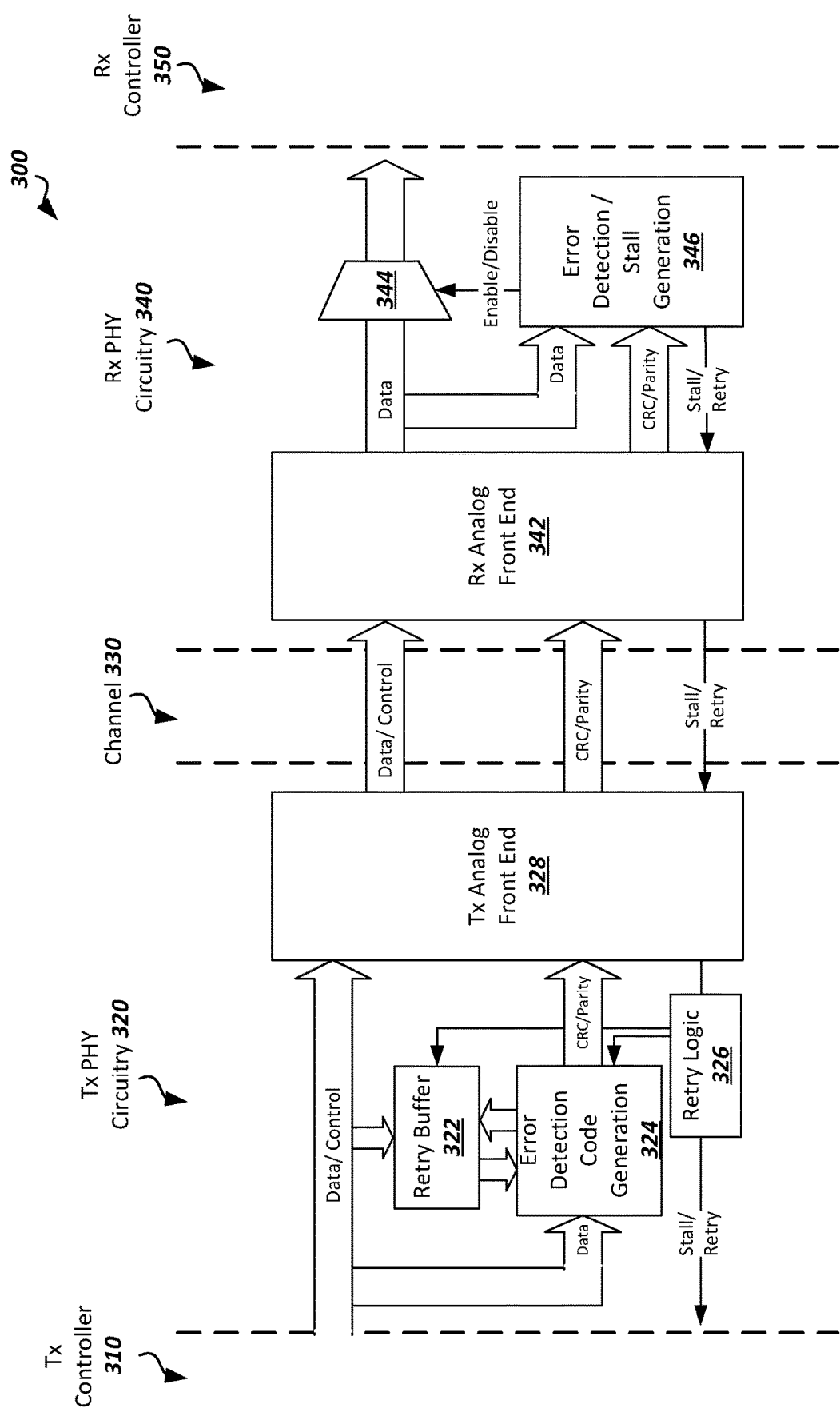
FIG. 3 illustrates an example physical layer (PHY)-based retry system in accordance with embodiments of the present disclosure.

FIG. 3 illustrates an example physical layer (PHY)-based retry system 300 in accordance with embodiments of the present disclosure. The example system 300 includes the same components as those shown in FIG. 2 and described above, with the exception that the retry buffer 322 of system 300 is positioned in parallel with the data path between the Tx interface 310 and the front end circuitry 328. While the mechanism described above with respect to FIG. 2 first fills the retry FIFO buffer 222 then overflows into the channel 230, the example system 300 causes the retry buffer 322 to fill in parallel with the data being transmitted over the channel 330, saving latency over the system 200 of FIG. 2.

The other components of FIG. 3 may be implemented in the same or similar manner as described above. That is, the Tx controller 310, Tx PHY circuitry 320, error detection code generation circuitry 324, retry logic 326, Tx AFE 328, channel 330, Rx AFE 342, multiplexer 344, error detection/stall generation circuitry 346, and Rx controller 350 may be implemented in the same or similar manner as the Tx controller 210, Tx PHY circuitry 220, error detection code generation circuitry 224, retry logic 226, Tx AFE 228, channel 230, Rx AFE 242, multiplexer 244, error detection/stall generation circuitry 246, and Rx controller 250, respectively.

Figure 4:
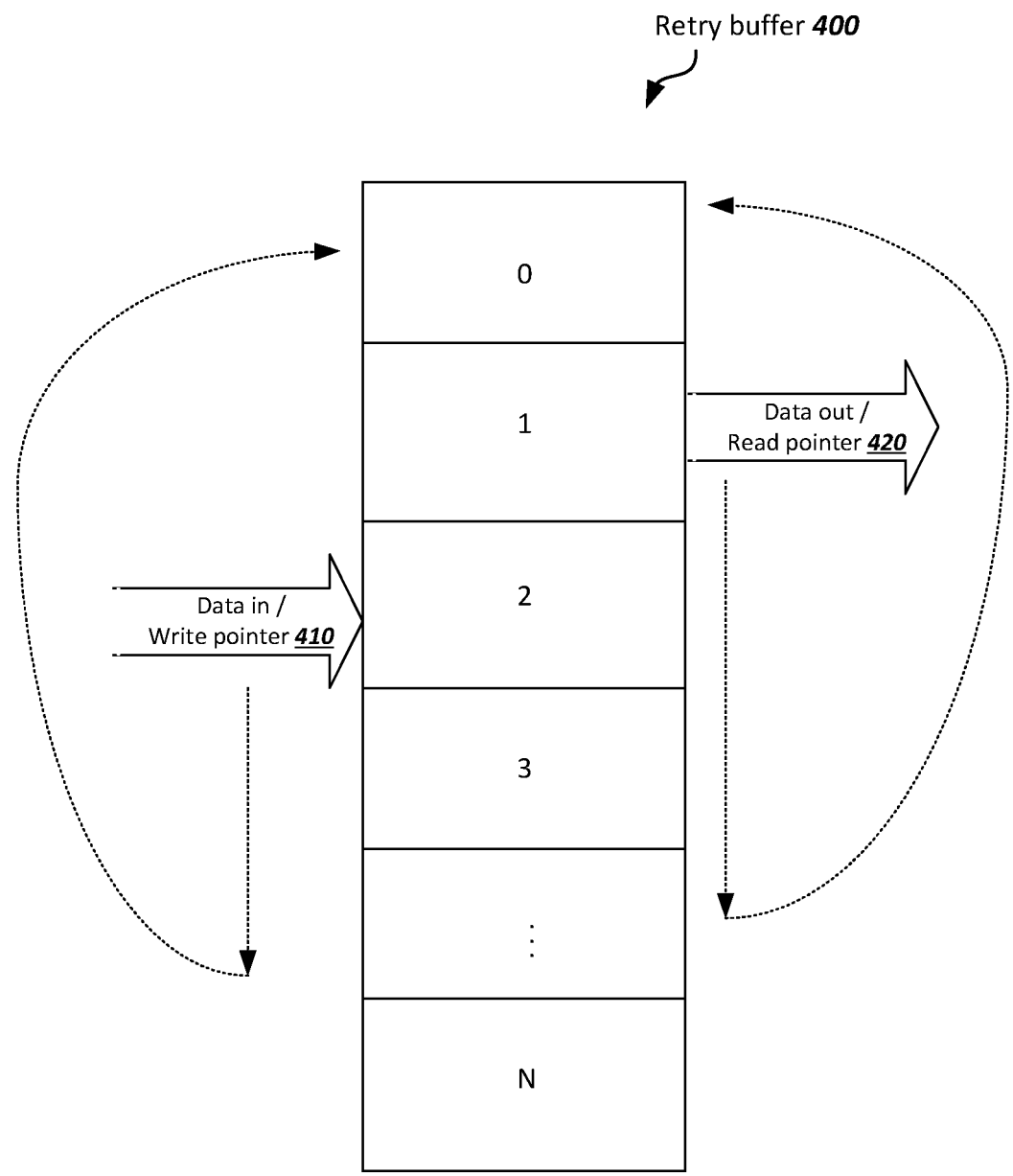
FIG. 4 illustrates an example retry buffer that may be used in a PHY-based retry system in accordance with embodiments of the present disclosure.

FIG. 4 illustrates an example retry buffer 400 that may be used in a PHY-based retry system (e.g., systems 200, 300) in accordance with embodiments of the present disclosure. In particular, FIG. 4 illustrates how a retry buffer may be used within the context of the techniques described herein. In the example shown, the retry buffer 400 is a fixed depth FIFO of depth N (which may be any suitable number); however, embodiments may implement another type of buffer for the retry buffer.

During normal operation, data is written to the buffer 400 (e.g., from the interface controller) using a write pointer 410 and is read from the buffer 400 (e.g., for transmission across the PHY channel) using a read pointer 420. As data is written into the buffer 400 using the write pointer 410, the pointer value moves "downward", e.g., starts at position 0 in the buffer 400 and increments on each write. Once the write pointer 410 reaches the $N^{th}$ buffer position, the write pointer moves back up to the $0^{th}$ position and then repeats the "downward" movement as data is written. The read pointer 420 moves in the same "downward" manner along with the write pointer 410, but at some distance behind the write pointer 410 (e.g., 1 position in the example shown). Like the write pointer 410, after the read pointer 420 has read from the $N^{th}$ buffer position, it moves to the $0^{th}$ position to perform the next read. The position of the data within the buffer may be transmitted along with the data, e.g., if the data came from the $0^{th}$ position of the buffer 400 a "0" or other indication of the $0^{th}$ position may be transmitted along with the data in the $0^{th}$ position so the receiver can track a position of the last known "good" data it receives without error.

Upon assertion of the stall signal as described above, the write pointer 410 may not change as new data is no longer being written to the buffer 400 and the read pointer 420 may return to a previous position in the buffer 400 to begin the retry process. For instance, in the example shown, assuming the retry signal was asserted when the pointers were at the positions shown, the read pointer may return to the $0^{th}$ position of the buffer 400 to begin the retry process, the $3^{rd}$ position of the retry buffer 400 (i.e., the oldest entry in the buffer 400), a position of the last known "good" data received at the receiver, or another position in the buffer 400. The read pointer may then move downward in the same manner as before to re-send the data in the retry process until de-assertion of the retry signal occurs or the read pointer reaches the position of the write pointer 410. As in normal operation, the position of the data within the buffer may be transmitted along with the data itself so the receiver can track. As stated above, the data from the buffer 400 may be used to generate the error detection codes during the retry phase of operation.

As an example, assume that the retry buffer 400 has a depth of 10 (i.e., N=10), and the receiver has detected an error in transmission of the data in the $5^{th}$ position of the buffer 400 (i.e., the last known good data was in the $4^{th}$ data position of the buffer 400). The retry buffer 400 may begin the retry phase by resending data from the $0^{th}$ position of the buffer 400, and the receiver may block its controller from receiving the data from the $0^{th}$-$4^{th}$ positions since those positions were already received and verified as "good" data (i.e., no errors) by the receiver. The receiver then begins its error detection process at the data that is within the $5^{th}$ position of the buffer 400. If no error is detected in data for a certain number/count of positions within the buffer, e.g., no errors in data of 2 buffer positions (e.g., the $5^{th}$ and $6^{th}$ position in this example), 4 buffer positions (e.g., the $5^{th}$-$8^{th}$ positions in this example), or another number of positions, or all once all buffer entries have been read, then the receiver may de-assert the stall signal and allow data to again flow into the buffer from the transmit controller.

Figure 5:
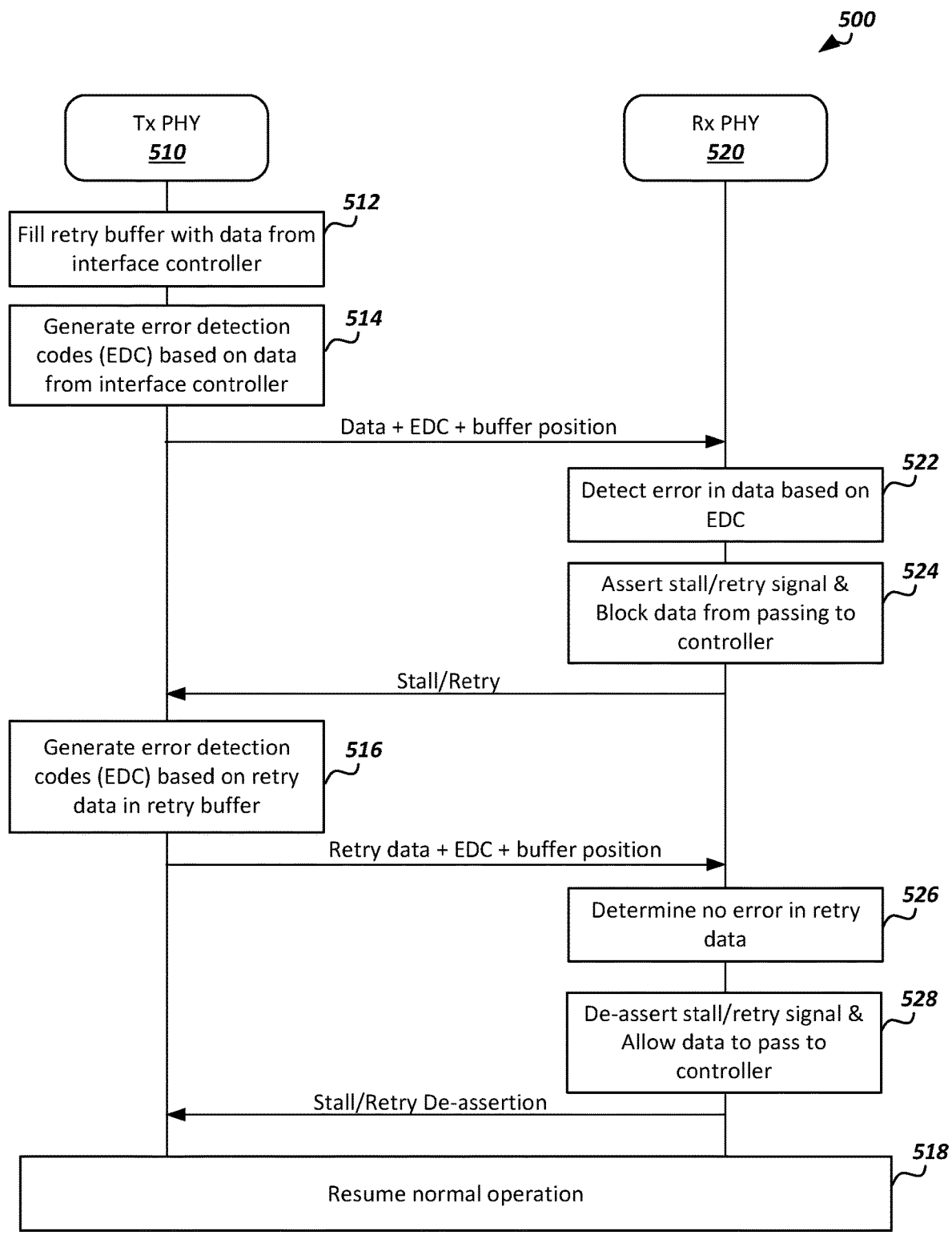
FIG. 5 illustrates a flow diagram of an example PHY-based retry process in accordance with embodiments of the present disclosure.

FIG. 5 illustrates a flow diagram of an example PHY-based retry process 500 in accordance with embodiments of the present disclosure. The example retry process 500 occurs between Tx PHY circuitry 510 and Rx PHY circuitry 520. The Tx PHY circuitry 510 may be implemented similar to (e.g., with components of) the example Tx PHY circuitry 220 of FIG. 2 or Tx PHY circuitry 320 of FIG. 3. Similarly, the Rx PHY circuitry 520 may be implemented similar to (e.g., with components of) the example Rx PHY circuitry 240 of FIG. 2 or Rx PHY circuitry 340 of FIG. 3. The example process 500 may be implemented in software, firmware, hardware, or a combination thereof within the respective PHY circuitries. In some embodiments, one or more computer-readable media may be encoded with instructions that implement one or more of the operations in the example process below when executed by a machine (e.g., firmware within a component of the PHY circuitry). The example process may include additional or different operations, and the operations may be performed in the order shown or in another order. In some cases, one or more of the operations shown in FIG. 5 are implemented as processes that include multiple operations, sub-processes, or other types of routines. In some cases, operations can be combined, performed in another order, performed in parallel, iterated, or otherwise repeated or performed another manner.

At 512, the Tx PHY circuitry 510 fills a retry buffer (e.g., 222 of FIG. 2 or 322 of FIG. 3) with data from a Tx interface controller (e.g., 210, 130). That is, the retry buffer buffers data from the Tx interface controller. The retry buffer may be a FIFO, or another type of buffer, e.g., an elastic buffer. The buffer may fill according to the operation described above with respect to FIG. 4.

At 514, the Tx PHY circuitry 510 generates error detection codes based on the data from the interface controller. The error detection codes may include one or more parity bits or a CRC code. The Tx PHY circuitry 510 may then transmit the data, error detection codes, and a position of the data within the retry buffer to the Rx PHY circuitry 520.

At 522, the Rx PHY circuitry 520 detects an error in the data based on the error detection codes sent with the data. For example, if the error detection code includes one or more parity bits, then the parity bits may be checked to determine whether a PHY-based transmission error has occurred. Likewise, if the error detection code includes CRC, then CRC checking may be performed to determine whether a PHY-based transmission error has occurred.

At 524, the Rx PHY circuitry 520 asserts a stall/retry signal to the Tx PHY circuitry 510 and blocks data received from the Tx PHY circuitry 510 from being passed to the Rx interface controller. This may include asserting a "disable" (e.g., "0") signal to a multiplexer in the Rx PHY circuitry 520 (e.g., as described above with respect to FIG. 2).

At 516, the Tx PHY circuitry 510 generates new error detection codes based on the data in the retry buffer ("retry data"). This may be done in the same manner as above with respect to 514, but with the retry data instead of data from the Tx interface controller. The new error detection codes and retry data are transmitted to the Rx PHY circuitry 520.

At 526, the Rx PHY circuitry 520 determines that no error exists in the retry data based on the new error detection codes sent with the retry data. The error detection determination may be performed in the same manner as above with respect to 522.

At 528, the Rx PHY circuitry 520 de-asserts the stall/retry signal to the Tx PHY circuitry 510 and allows data received from the Tx PHY circuitry 510 to be passed to the Rx controller. In some instances, Rx PHY circuitry 520 may de-assert the stall/retry signal based on determining that it has replayed all data up to the last known "good" data it received from the Tx PHY circuitry 510. For example, the Rx PHY circuitry 520 may track and compare the buffer position of the retry data sent with the buffer position of the last known good data received from the Tx PHY circuitry 510.

At 518, normal operations resumed between the Tx PHY circuitry 510 and Rx PHY circuitry 520. This may include filling the retry buffer with data from the interface controller, generating error detection codes based on the data, and transmitting the data and error detection codes across the channel (e.g., along with the position of the data within the retry buffer) as described above (e.g., in 512, 514).

Figure 6:
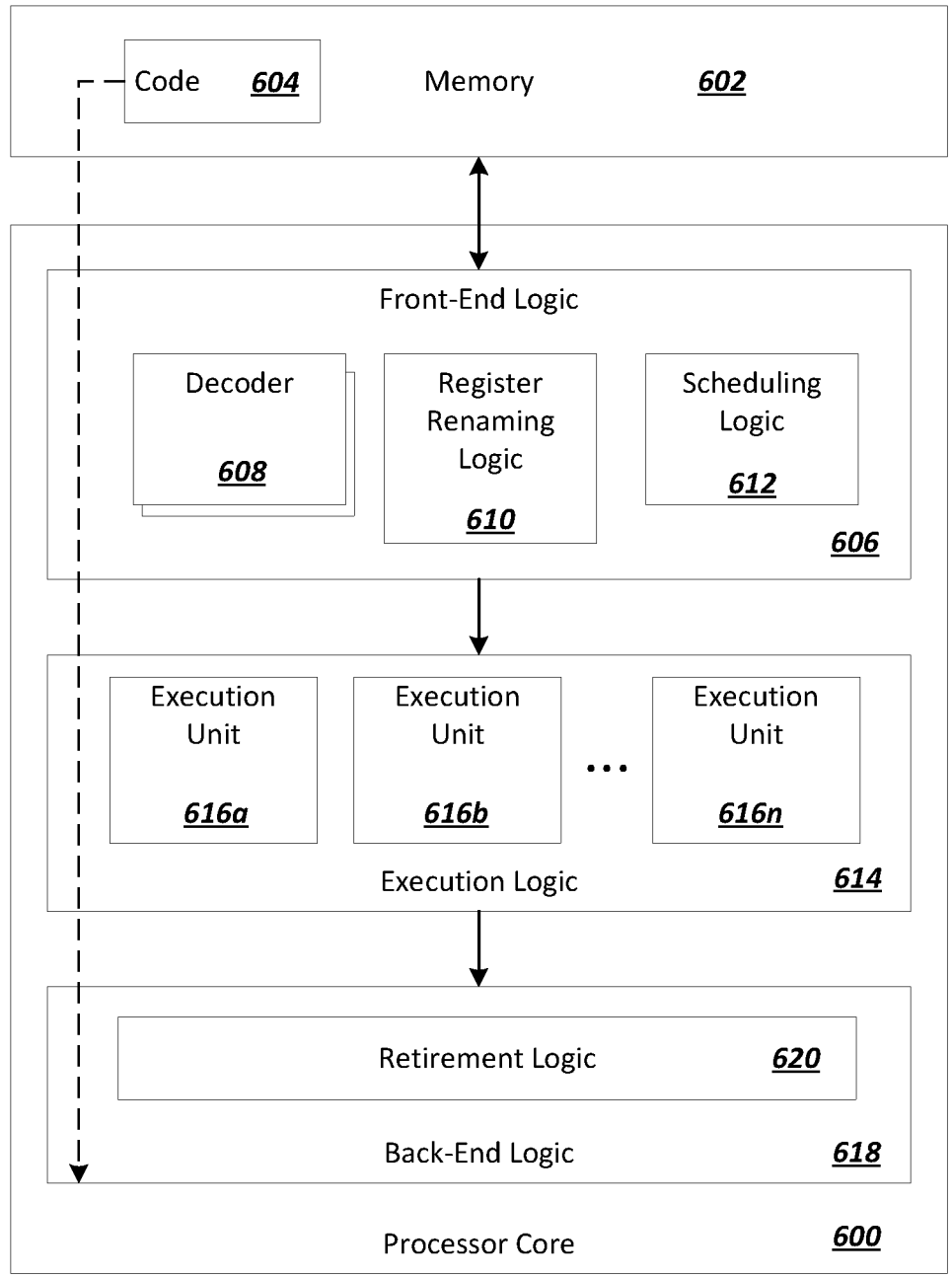
FIG. 6 is an example illustration of a processor according to an embodiment.
Figure 7:
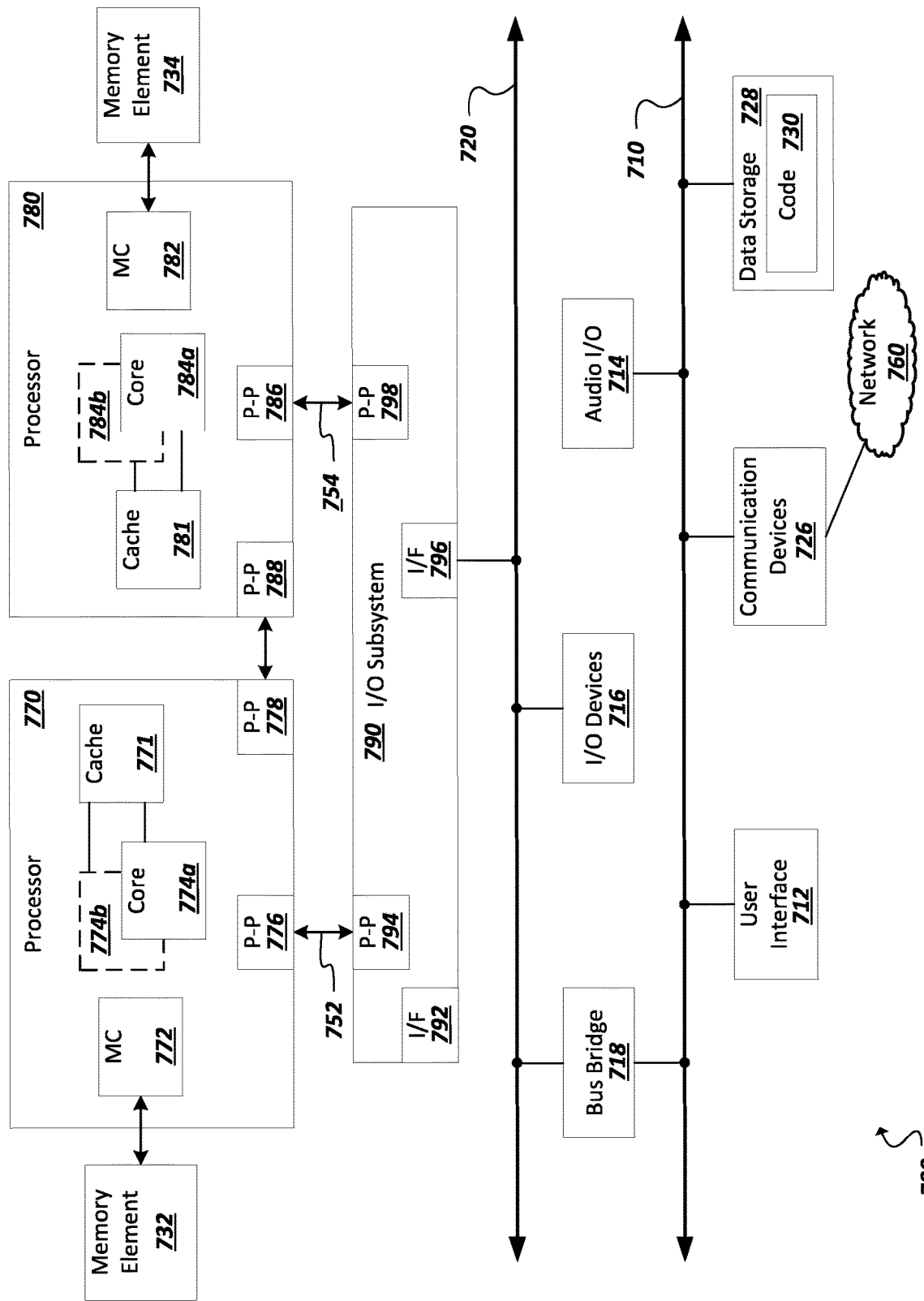
FIG. 7 illustrates a computing system that is arranged in a point-to-point (PtP) configuration according to an embodiment.

FIGS. 6-7 are block diagrams of example computer architectures that may be used in accordance with embodiments disclosed herein. For example, in some embodiments, a computer system may contain one or more aspects shown in FIGS. 6-7 and may implement one or more aspects of the present disclosure. Other computer architecture designs known in the art for processors and computing systems may also be used. Generally, suitable computer architectures for embodiments disclosed herein can include, but are not limited to, configurations illustrated in FIGS. 6-7.

FIG. 6 is an example illustration of a processor according to an embodiment. Processor 600 is an example of a type of hardware device that can be used in connection with the implementations above. Processor 600 may be any type of processor, such as a microprocessor, an embedded processor, a digital signal processor (DSP), a network processor, a multi-core processor, a single core processor, or other device to execute code. Although only one processor 600 is illustrated in FIG. 6, a processing element may alternatively include more than one of processor 600 illustrated in FIG. 6. Processor 600 may be a single-threaded core or, for at least one embodiment, the processor 600 may be multi-threaded in that it may include more than one hardware thread context (or "logical processor") per core.

FIG. 6 also illustrates a memory 602 coupled to processor 600 in accordance with an embodiment. Memory 602 may be any of a wide variety of memories (including various layers of memory hierarchy) as are known or otherwise available to those of skill in the art. Such memory elements can include, but are not limited to, random access memory (RAM), read only memory (ROM), logic blocks of a field programmable gate array (FPGA), erasable programmable read only memory (EPROM), and electrically erasable programmable ROM (EEPROM).

Processor 600 can execute any type of instructions associated with algorithms, processes, or operations detailed herein. Generally, processor 600 can transform an element or an article (e.g., data) from one state or thing to another state or thing.

Code 604, which may be one or more instructions to be executed by processor 600, may be stored in memory 602, or may be stored in software, hardware, firmware, or any suitable combination thereof, or in any other internal or external component, device, element, or object where appropriate and based on particular needs. In one example, processor 600 can follow a program sequence of instructions indicated by code 604. Each instruction enters a front-end logic 606 and is processed by one or more decoders 608. The decoder may generate, as its output, a micro operation such as a fixed width micro operation in a predefined format, or may generate other instructions, microinstructions, or control signals that reflect the original code instruction. Front-end logic 606 also includes register renaming logic 610 and scheduling logic 612, which generally allocate resources and queue the operation corresponding to the instruction for execution.

Processor 600 can also include execution logic 614 having a set of execution units 616a, 616b, 616n, etc. Some embodiments may include a number of execution units dedicated to specific functions or sets of functions. Other embodiments may include only one execution unit or one execution unit that can perform a particular function. Execution logic 614 performs the operations specified by code instructions.

After completion of execution of the operations specified by the code instructions, back-end logic 618 can retire the instructions of code 604. In one embodiment, processor 600 allows out of order execution but requires in order retirement of instructions. Retirement logic 620 may take a variety of known forms (e.g., re-order buffers or the like). In this manner, processor 600 is transformed during execution of code 604, at least in terms of the output generated by the decoder, hardware registers and tables utilized by register renaming logic 610, and any registers (not shown) modified by execution logic 614.

Although not shown in FIG. 6, a processing element may include other elements on a chip with processor 600. For example, a processing element may include memory control logic along with processor 600. The processing element may include I/O control logic and/or may include I/O control logic integrated with memory control logic. The processing element may also include one or more caches. In some embodiments, non-volatile memory (such as flash memory or fuses) may also be included on the chip with processor 600.

FIG. 7 illustrates a computing system 700 that is arranged in a point-to-point (PtP) configuration according to an embodiment. In particular, FIG. 7 shows a system where processors, memory, and input/output devices are interconnected by a number of point-to-point interfaces. Generally, one or more of the computing systems described herein may be configured in the same or similar manner as computing system 700.

Processors 770 and 780 may also each include integrated memory controller logic (MC) 772 and 782 to communicate with memory elements 732 and 734. In alternative embodiments, memory controller logic 772 and 782 may be discrete logic separate from processors 770 and 780. Memory elements 732 and/or 734 may store various data to be used by processors 770 and 780 in achieving operations and functionality outlined herein.

Processors 770 and 780 may be any type of processor, such as those discussed in connection with other figures. Processors 770 and 780 may exchange data via a point-to-point (PtP) interface 750 using point-to-point interface circuits 778 and 788, respectively. Processors 770 and 780 may each exchange data with a chipset 790 via individual point-to-point interfaces 752 and 754 using point-to-point interface circuits 776, 786, 794, and 798. Chipset 790 may also exchange data with a co-processor 738, such as a high-performance graphics circuit, machine learning accelerator, or other co-processor 738, via an interface 739, which could be a PtP interface circuit. In alternative embodiments, any or all of the PtP links illustrated in FIG. 7 could be implemented as a multi-drop bus rather than a PtP link.

Chipset 790 may be in communication with a bus 720 via an interface circuit 796. Bus 720 may have one or more devices that communicate over it, such as a bus bridge 718 and I/O devices 716. Via a bus 710, bus bridge 718 may be in communication with other devices such as a user interface 712 (such as a keyboard, mouse, touchscreen, or other input devices), communication devices 726 (such as modems, network interface devices, or other types of communication devices that may communicate through a computer network 760), audio I/O devices 716, and/or a data storage device 728. Data storage device 728 may store code 730, which may be executed by processors 770 and/or 780. In alternative embodiments, any portions of the bus architectures could be implemented with one or more PtP links.

The computer system depicted in FIG. 7 is a schematic illustration of an embodiment of a computing system that may be utilized to implement various embodiments discussed herein. It will be appreciated that various components of the system depicted in FIG. 7 may be combined in a system-on-a-chip (SoC) architecture or in any other suitable configuration capable of achieving the functionality and features of examples and implementations provided herein.

While some of the systems and solutions described and illustrated herein have been described as containing or being associated with a plurality of elements, not all elements explicitly illustrated or described may be utilized in each alternative implementation of the present disclosure. Additionally, one or more of the elements described herein may be located external to a system, while in other instances, certain elements may be included within or as a portion of one or more of the other described elements, as well as other elements not described in the illustrated implementation. Further, certain elements may be combined with other components, as well as used for alternative or additional purposes in addition to those purposes described herein.

Further, it should be appreciated that the examples presented above are non-limiting examples provided merely for purposes of illustrating certain principles and features and not necessarily limiting or constraining the potential embodiments of the concepts described herein. For instance, a variety of different embodiments can be realized utilizing various combinations of the features and components described herein, including combinations realized through the various implementations of components described herein. Other implementations, features, and details should be appreciated from the contents of this Specification.

Although this disclosure has been described in terms of certain implementations and generally associated methods, alterations and permutations of these implementations and methods will be apparent to those skilled in the art. For example, the actions described herein can be performed in a different order than as described and still achieve the desirable results. As one example, the processes depicted in the accompanying figures do not necessarily require the particular order shown, or sequential order, to achieve the desired results. In certain implementations, multitasking and parallel processing may be advantageous. Additionally, other user interface layouts and functionality can be supported. Other variations are within the scope of the following claims.

While this specification contains many specific implementation details, these should not be construed as limitations on the scope of any embodiments or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The following examples pertain to embodiments in accordance with this Specification. It will be understood that certain examples may be combined with certain other examples, in certain embodiments.

Example 1 includes an apparatus comprising: interface controller circuitry; and physical layer (PHY) circuitry coupled to the interface controller circuitry and to transmit data over a channel based on input from the interface controller circuitry, the PHY circuitry comprising: a retry buffer to buffer data provided by the interface controller; and error detection code generation circuitry to generate error detection codes based on input data; wherein the PHY circuitry is to: detect a stall signal asserted by another apparatus across the channel; cause the error detection code generation circuitry to generate error detection codes based on data in the retry buffer; and transmit the data from the retry buffer and its corresponding error detection codes across the channel to the other apparatus.

Example 2 includes the subject matter of Example 1, wherein the PHY circuitry is further to: detect a de-assertion of the stall signal by the other apparatus; cause the error detection code generation circuitry to generate error detection codes based on data provided by the interface controller circuitry; and transmit the data from the interface controller circuitry and its corresponding error detection codes across the channel to the other apparatus.

Example 3 includes the subject matter of Example 1 or 2, wherein the PHY circuitry is further to pass the stall signal to the interface controller circuitry and the interface controller circuitry is to stop providing data to the PHY circuitry based on the stall signal.

Example 4 includes the subject matter of Example 2, wherein the PHY circuitry is further to pass the de-assertion of the stall signal to the interface controller circuitry and the interface controller circuitry is to resume providing data to the PHY circuitry based on the de-assertion of the stall signal.

Example 5 includes the subject matter of any one of Examples 1-4, wherein the PHY circuitry is further to receive data and corresponding error detection codes from across the channel, and the PHY circuitry further comprises error detection circuitry to: detect errors in the data received across the channel based on the error detection codes corresponding to the data received across the channel; and based on detection of an error, assert a stall signal across the channel and block the data being received across the channel from being passed to the interface controller circuitry.

Example 6 includes the subject matter of Example 5, wherein the PHY circuitry is further to: receive retry data and corresponding error correction codes across the channel after assertion of the stall signal; and determine whether an error exists in the retry data based on the error correction codes corresponding to the retry data; de-assert the stall signal across the channel based on determining that no error exists in the retry data; and allow data received across the channel to be passed to the interface controller circuitry.

Example 7 includes the subject matter of Example 6, wherein the PHY circuitry is further to receive an indication of a position within a retry buffer along with the retry data, wherein de-asserting the stall signal is based on comparing the indicated position with a position within the buffer of previously-received data known to not have an error.

Example 8 includes the subject matter of any one of Examples 1-7, wherein the PHY circuitry is further to transmit an indication of a position within the retry buffer along with the data from the retry buffer and the error detection codes.

Example 9 includes the subject matter of any one of Examples 1-8, wherein the retry buffer is a first-in/first-out (FIFO) buffer.

Example 10 includes the subject matter of any one of Examples 1-9, wherein the retry buffer is to be filled with data from the interface controller circuitry prior to the data being transmitted across the channel.

Example 11 includes the subject matter of any one of Examples 1-9, wherein the retry buffer is to be filled in parallel with data from the interface controller being transmitted across the channel.

Example 12 includes the subject matter of any one of Examples 1-11, wherein the error detection code generation circuitry is to generate one or more parity bits or a cyclic redundancy check (CRC) code.

Example 13 includes the subject matter of any one of Examples 1-12, wherein the apparatus is one or more of a processor, memory module, accelerator, or input/output (IO) circuitry.

Example 14 includes a system comprising: a first die; a second die; and a die-to-die-interface to couple the first die and the second die; wherein the first die comprises a first interface controller and first PHY circuitry, the first PHY circuitry comprising: a retry buffer; error detection code generation circuitry; wherein the first PHY circuitry is to transmit data from the first interface controller and error correction codes corresponding to the data generated by the error detection code generation circuitry; the second die comprises a second interface controller and second PHY circuitry, the second PHY circuitry comprising: error detection circuitry to detect errors in the data transmitted by the first PHY circuitry based on the error detection codes; and based on detection of an error in the data, assert a stall signal to the first PHY circuitry and block the data from being passed to the second interface controller; and the first PHY circuitry is further to: detect the stall signal asserted by the second PHY circuitry; and based on detecting the asserted stall signal, transmit retry data from the retry buffer and error correction codes corresponding to the retry data generated by the error detection code generation circuitry.

Example 15 includes the subject matter of Example 14, wherein the first PHY circuitry is further to pass the stall signal to the first interface controller.

Example 16 includes the subject matter of Example 14, wherein the second PHY circuitry is further to: receive the retry data and corresponding error correction codes from the first PHY circuitry; determine whether an error exists in the retry data based on the error correction codes corresponding to the retry data; and de-assert the stall signal to the first PHY circuitry based on determining that no error exists in the retry data.

Example 17 includes the subject matter of Example 16, wherein the first PHY circuitry is further to transmit an indication of a position within the retry buffer along with the data from the retry buffer, and the second PHY circuitry is to de-assert the stall signal based on comparing the indicated position with a position within the buffer of previously-received data known to not have an error.

Example 18 includes the subject matter of Example 16, wherein the first PHY circuitry is further to, based on the de-assertion of the stall signal, transmit data from the first interface controller and corresponding error detection codes generated by the error code generation circuitry to the second PHY circuitry.

Example 19 includes the subject matter of Example 18, wherein the second PHY circuitry is further to allow received from the first PHY circuitry to be passed to the second interface controller.

Example 20 includes the subject matter of any one of Examples 14-19, wherein the retry buffer is a first-in/first-out (FIFO) buffer.

Example 21 includes the subject matter of any one of Examples 14-20, wherein the first PHY circuitry is to fill the retry buffer with data from the first interface controller prior to the data being transmitted to the second PHY circuitry.

Example 22 includes the subject matter of any one of Examples 14-20, wherein the first PHY circuitry is to fill the retry buffer in parallel with transmitting the data from the interface controller to the second PHY circuitry.

Example 23 includes the subject matter of any one of Examples 14-22, wherein the error detection code generation circuitry is to generate one or more parity bits or a cyclic redundancy check (CRC) code.

Example 24 includes the subject matter of any one of Examples 14-23, wherein the first die comprises one or more of a processor, memory module, accelerator, or input/output (IO) circuitry.

Example 25 includes the subject matter of one of Examples 14-24, wherein the system comprises a system-on-chip (SoC).

Example 26 includes a method comprising: filling, by first physical layer (PHY) circuitry, a retry buffer with data from an interface controller; generating, by the first PHY circuitry, error detection codes based on the data; transmitting the data and corresponding error correction codes to second PHY circuitry; detecting, at the first PHY circuitry, a stall signal asserted by the second PHY circuitry; generating, by the first PHY circuitry, error detection codes for the data in the retry buffer; and transmitting the data from the retry buffer and its corresponding error detection codes to the second PHY circuitry.

Example 27 includes the subject matter of Example 26, further comprising: detecting, by the first PHY circuitry, a de-assertion of the stall signal by the second PHY circuitry; generating, by the first PHY circuitry, error detection codes for the data from the interface controller; and transmitting the data from the interface controller and its corresponding error detection codes to the second PHY circuitry.

Example 28 includes the subject matter of Example 26 or 27, further comprising transmitting and indication of a position within the retry buffer along with the data from the retry buffer.

Example 29 includes a method comprising: receiving, at second physical layer (PHY) circuitry, data and error correction codes corresponding to the data from first PHY circuitry; detecting, by the second PHY circuitry, an error in the data based on the error correction codes; blocking, by the second PHY circuitry, the data from being passed to an interface controller for processing based on the detected error; and asserting, by the second PHY circuitry, a stall signal to the first PHY circuitry based on the detected error.

Example 30 includes the subject matter of Example 29, further comprising: receiving, at the second PHY circuitry, retry data and error correction codes corresponding to the retry data from the first PHY circuitry; determining that no error exists in the retry data based on the error correction codes; allowing the retry data to be passed to the interface controller based on the detection of no error in the retry data; and de-asserting the stall signal to the first PHY circuitry.

Example 31 includes the subject matter of Example 30, further comprising receiving an indication of a position within the retry buffer along with the data from the retry buffer, wherein de-asserting the stall signal is based on comparing the indicated position with a position within the buffer of previously-received data known to not have an error.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results.

What is claimed is:

1. An apparatus comprising:
   interface controller circuitry; and
   physical layer (PHY) circuitry coupled to the interface controller circuitry and to transmit data over a channel based on input from the interface controller circuitry, the PHY circuitry comprising:
      a retry buffer to buffer data provided by the interface controller; and
      error detection code generation circuitry to generate error detection codes based on input data;
   wherein the PHY circuitry is to:
      detect a stall signal asserted by another apparatus across the channel;
      cause the error detection code generation circuitry to generate error detection codes based on data in the retry buffer; and
      transmit the data from the retry buffer and its corresponding error detection codes across the channel to the other apparatus.

2. The apparatus of claim 1, wherein the PHY circuitry is further to:
   detect a de-assertion of the stall signal by the other apparatus;
   cause the error detection code generation circuitry to generate error detection codes based on data provided by the interface controller circuitry; and
   transmit the data from the interface controller circuitry and its corresponding error detection codes across the channel to the other apparatus.

3. The apparatus of claim 2, wherein the PHY circuitry is further to pass the de-assertion of the stall signal to the interface controller circuitry and the interface controller circuitry is to resume providing data to the PHY circuitry based on the de-assertion of the stall signal.

4. The apparatus of claim 1, wherein the PHY circuitry is further to pass the stall signal to the interface controller circuitry and the interface controller circuitry is to stop providing data to the PHY circuitry based on the stall signal.

5. The apparatus of claim 1, wherein the PHY circuitry is further to receive data and corresponding error detection codes from across the channel, and the PHY circuitry further comprises error detection circuitry to:
   detect errors in the data received across the channel based on the error detection codes corresponding to the data received across the channel; and
   based on detection of an error, assert a stall signal across the channel and block the data being received across the channel from being passed to the interface controller circuitry.

6. The apparatus of claim 5, wherein the PHY circuitry is further to:
   receive retry data and corresponding error correction codes across the channel after assertion of the stall signal;
   determine whether an error exists in the retry data based on the error correction codes corresponding to the retry data;
   de-assert the stall signal across the channel based on determining that no error exists in the retry data; and
   allow data received across the channel to be passed to the interface controller circuitry.

7. The apparatus of claim 6, wherein the PHY circuitry is further to receive an indication of a position within a retry buffer along with the retry data, wherein de-asserting the stall signal is based on comparing the indicated position with a position within the buffer of previously-received data known to not have an error.

8. The apparatus of claim 1, wherein the PHY circuitry is further to transmit an indication of a position within the retry buffer along with the data from the retry buffer and the error detection codes.

9. The apparatus of claim 1, wherein the retry buffer is a first-in/first-out (FIFO) buffer.

10. The apparatus of claim 1, wherein the retry buffer is to be filled with data from the interface controller circuitry prior to the data being transmitted across the channel.

11. The apparatus of claim 1, wherein the retry buffer is to be filled in parallel with data from the interface controller being transmitted across the channel.

12. The apparatus of claim 1, wherein the error detection code generation circuitry is to generate one or more parity bits or a cyclic redundancy check (CRC) code.

13. A system comprising:
   a first die;
   a second die; and
   a die-to-die-interface to couple the first die and the second die;
   wherein the first die comprises a first interface controller and first PHY circuitry, the first PHY circuitry comprising:
      a retry buffer; and
      error detection code generation circuitry;
      wherein the first PHY circuitry is to transmit data from the first interface controller and error correction codes corresponding to the data generated by the error detection code generation circuitry;
   the second die comprises a second interface controller and second PHY circuitry, the second PHY circuitry comprising:
      error detection circuitry to detect errors in the data transmitted by the first PHY circuitry based on the error detection codes, and based on detection of an error in the data, assert a stall signal to the first PHY circuitry and block the data from being passed to the second interface controller; and
   the first PHY circuitry is further to:
      detect the stall signal asserted by the second PHY circuitry; and
      based on detecting the asserted stall signal, transmit retry data from the retry buffer and error correction codes corresponding to the retry data generated by the error detection code generation circuitry.

14. The system of claim 13, wherein the first PHY circuitry is further to pass the stall signal to the first interface controller.

15. The system of claim 13, wherein the second PHY circuitry is further to:
   receive the retry data and corresponding error correction codes from the first PHY circuitry;
   determine whether an error exists in the retry data based on the error correction codes corresponding to the retry data; and
   de-assert the stall signal to the first PHY circuitry based on determining that no error exists in the retry data.

16. The system of claim 15, wherein the first PHY circuitry is further to transmit an indication of a position within the retry buffer along with the data from the retry buffer, and the second PHY circuitry is to de-assert the stall signal based on comparing the indicated position with a position within the buffer of previously-received data known to not have an error.

17. The system of claim 15, wherein:
the first PHY circuitry is further to, based on the de-assertion of the stall signal, transmit data from the first interface controller and corresponding error detection codes generated by the error code generation circuitry to the second PHY circuitry; and
the second PHY circuitry is further to allow received from the first PHY circuitry to be passed to the second interface controller.

18. The system of claim 13, wherein the first die comprises one or more of a processor, memory module, accelerator, or input/output (IO) circuitry.

19. The system of claim 13, wherein the system comprises a system-on-chip (SoC).

20. A method comprising:
filling, by first physical layer (PHY) circuitry, a retry buffer with data from an interface controller;
generating, by the first PHY circuitry, error detection codes based on the data;
transmitting the data and corresponding error correction codes to second PHY circuitry;
detecting, at the first PHY circuitry, a stall signal asserted by the second PHY circuitry;
generating, by the first PHY circuitry, error detection codes for the data in the retry buffer; and
transmitting the data from the retry buffer and its corresponding error detection codes to the second PHY circuitry.

21. The method of claim 20, further comprising:
detecting, by the first PHY circuitry, a de-assertion of the stall signal by the second PHY circuitry;
generating, by the first PHY circuitry, error detection codes for the data from the interface controller; and
transmitting the data from the interface controller and its corresponding error detection codes to the second PHY circuitry.

22. The method of claim 20, further comprising transmitting and indication of a position within the retry buffer along with the data from the retry buffer.

23. A method comprising:
receiving, at second physical layer (PHY) circuitry, data and error correction codes corresponding to the data from first PHY circuitry;
detecting, by the second PHY circuitry, an error in the data based on the error correction codes;
blocking, by the second PHY circuitry, the data from being passed to an interface controller for processing based on the detected error;
asserting, by the second PHY circuitry, a stall signal to the first PHY circuitry based on the detected error;
receiving, at the second PHY circuitry from the first PHY circuitry, retry data, error correction codes corresponding to the retry data, and an indication of a position of the retry data within a retry buffer of the first PHY circuitry;
determining that no error exists in the retry data based on the error correction codes corresponding to the retry data and on comparing the indicated position with a position of previously-received data known to not have an error; and
based on determining that no error exists in the retry data, allowing the retry data to be passed to the interface controller and de-asserting the stall signal to the first PHY circuitry.

* * * * *